(12) United States Patent
Bigman

(10) Patent No.: US 10,586,007 B1
(45) Date of Patent: Mar. 10, 2020

(54) MULTI-DIMENSIONAL PLACEMENT

(71) Applicant: EMC IP Holding Company LLC, Hopkinton, MA (US)

(72) Inventor: Ron Bigman, Holon (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 146 days.

(21) Appl. No.: 15/662,617

(22) Filed: Jul. 28, 2017

(51) Int. Cl.
*G06F 17/50* (2006.01)
*H03M 7/30* (2006.01)
*G06F 3/06* (2006.01)

(52) U.S. Cl.
CPC ...... *G06F 17/5068* (2013.01); *G06F 17/5072* (2013.01); *G06F 17/5077* (2013.01); *H03M 7/30* (2013.01); *G06F 3/067* (2013.01); *G06F 3/0608* (2013.01)

(58) Field of Classification Search
USPC .................................................. 716/100–106
See application file for complete search history.

(56) References Cited

U.S. PATENT DOCUMENTS

| 6,477,683 | B1* | 11/2002 | Killian | G06F 17/5045 716/104 |
| 2008/0119953 | A1* | 5/2008 | Reed | G06F 16/68 700/94 |
| 2012/0089893 | A1* | 4/2012 | Bousamra | A61B 5/14532 714/807 |

* cited by examiner

*Primary Examiner* — Binh C Tat
(74) *Attorney, Agent, or Firm* — Daly, Crowley Mofford & Durkee, LLP

(57) ABSTRACT

A multi-dimensional placement methodology, system and computer readable medium is presented. A plurality of data sets is ordered by need. A plurality of storage areas are defined based on a storage device type, an associated compression algorithm, and a plurality of parameters associated with different properties of the particular storage device and the compression algorithm being used. A data set is placed in a selected storage area based on a determination of which storage area provides a desired combination of the storage device type and compression.

16 Claims, 4 Drawing Sheets

MULTI-DIMENSIONAL PLACEMENT

BACKGROUND

Figure 1:
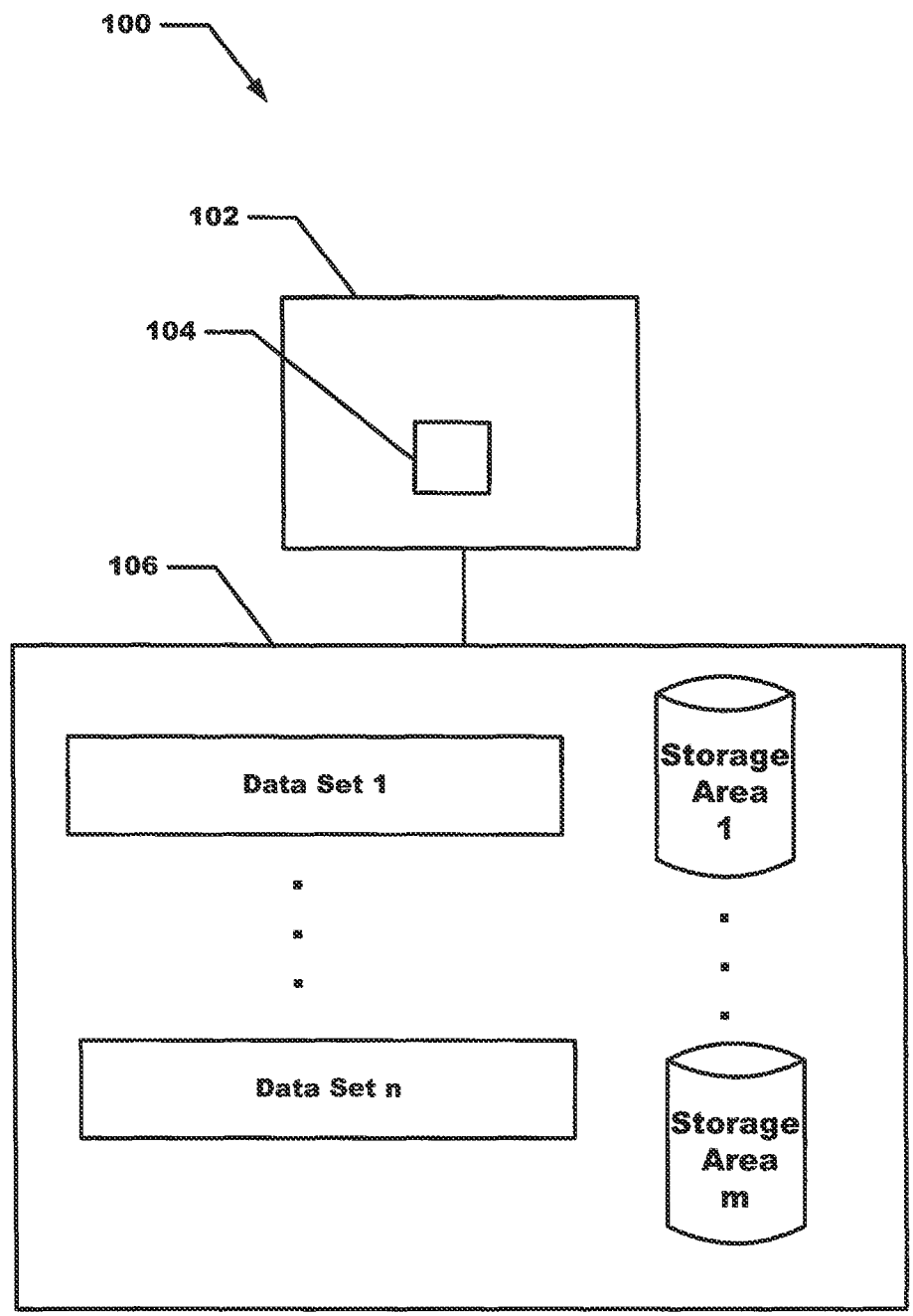

Many storage solutions offer compression algorithms in order to preserve expensive space on the storage arrays. This may be important with the use of more all flash arrays, introducing faster yet more expensive drives. There are many different compression algorithms each offering different features and having advantages and disadvantages, as well as different drive types that the different compression algorithms may be used on.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One aspect provides a method for providing multi-dimensional placement of data sets. In one embodiment, the method includes ordering a plurality of data sets by need. The method may further include defining a plurality of storage areas based on a storage device type, an associated compression algorithm, and a plurality of parameters associated with different properties of the particular storage device and the compression algorithm being used. The method may further include placing a data set in a selected storage area based on a determination of which storage area provides a desired combination of the compression type and the storage device type.

In another aspect, an apparatus includes electronic hardware circuitry configured to store a data sets on a storage array. The hardware is configured to order a plurality of data sets based on need. The hardware is further configured to define a plurality of storage areas based on a storage device type, an associated compression algorithm, and a plurality of parameters associated with different properties of the particular storage device and the compression algorithm being used. The hardware may be further configured to place a data set in a selected storage area based on a determination of which storage area provides a desired combination of the compression and storage device type.

In a further aspect, an article includes a non-transitory computer-readable medium that stores computer-executable instructions and the instructions cause a machine to store a data sets on a storage array. The computer readable medium further includes computer-executable instructions to order a plurality of data sets based on need. The computer readable medium further includes computer-executable instructions to define a plurality of storage areas based on a storage device type, an associated compression algorithm, and a plurality of parameters associated with different properties of the particular storage device and the compression algorithm. The computer readable medium further includes computer-executable instructions to place a data set in a selected storage area based on a determination of which storage area provides a desired combination of the storage device type and compression.

BRIEF DESCRIPTION OF THE DRAWING FIGURES

Objects, aspects, features, and advantages of embodiments disclosed herein will become more fully apparent from the following detailed description, the appended claims, and the accompanying drawings in which like reference numerals identify similar or identical elements. Reference numerals that are introduced in the specification in association with a. drawing figure may be repeated in one or more subsequent figures without additional description in the specification in order to provide context for other features. For clarity, not every element may be labeled in every figure. The drawings are not necessarily to scale, emphasis instead being placed upon illustrating embodiments, principles, and concepts. The drawings are not meant to limit the scope of the claims included herewith.

Figure 2A:
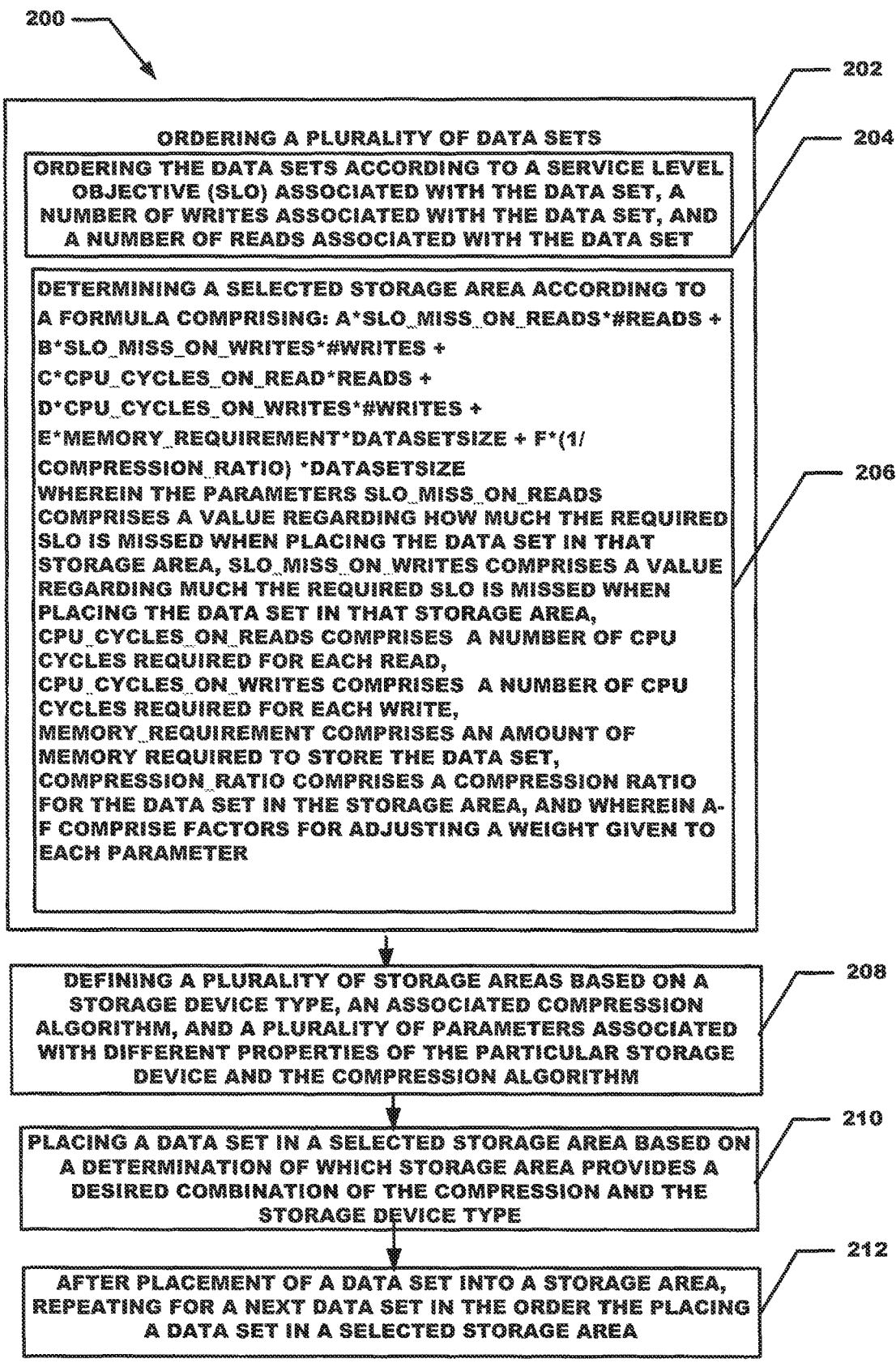
Figure 2B:
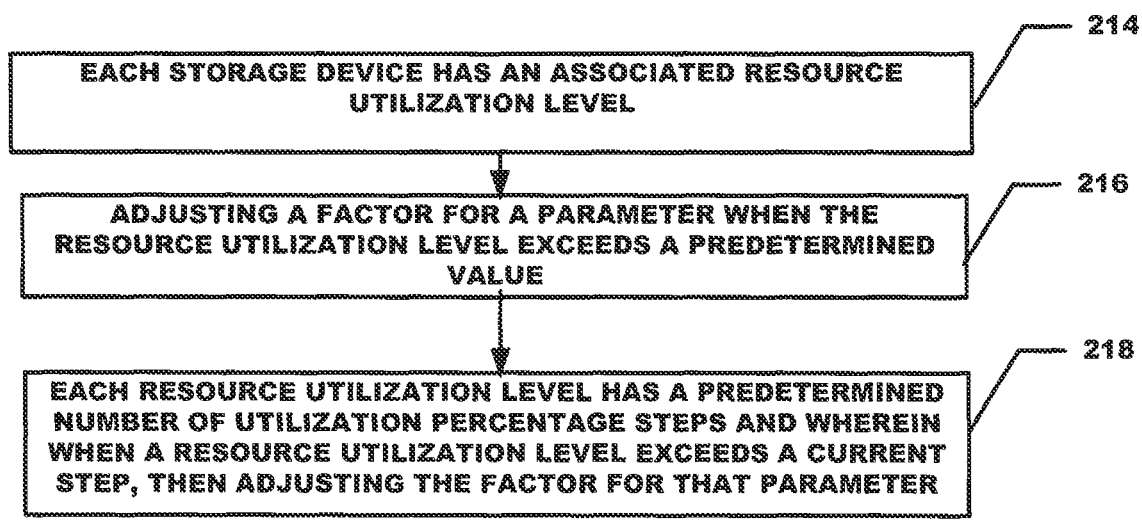
Figure 3:
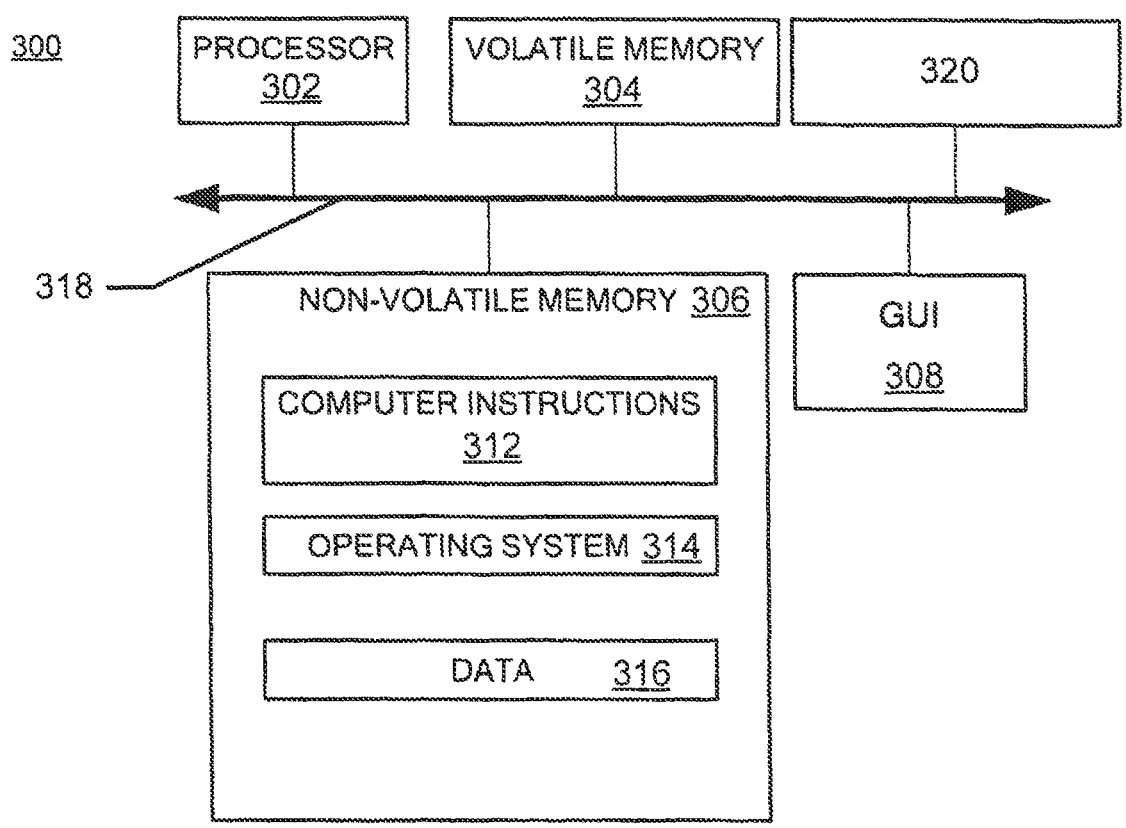

FIG. 1 is a block diagram of a storage system, in accordance with illustrative embodiments;

FIGS. 2A and 2B comprise a flowchart of an illustrative multi-dimensional placement process in accordance with illustrative embodiments;

FIG. 3 is a block diagram of an example of a hardware device that may perform at least a portion of the processes in FIGS. 2A and 2B.

DETAILED DESCRIPTION

Before describing embodiments of the concepts, structures, and techniques sought to be protected herein, some terms are explained. In smile embodiments, the term "storage system" may encompass physical computing systems, cloud or virtual computing systems, or a combination thereof. The term "storage device" may refer to any non-volatile memory (NVM) device, including hard disk drives (HDDs), solid state drivers (SSDs), flash devices (e.g.. NAND flash devices), and similar devices that may be accessed locally and/or remotely (e.g., via a storage attached network (SAN)). The term "storage device" may also refer to a storage array including multiple storage devices.

The term "data set" refers to an extent of a certain size, which is stored and viewed as sequential data by the application.

The capability to use different compression algorithms for different data sets within the same storage machine is known. This technique, sometimes referred to as compression based tiering, ranks a compression algorithm according to two main parameters: how well the compression algorithm compresses data sets, and how much resources and time are required to apply that compression algorithm. Each data is given a score per its activity level, placing the data sets with high activity at the top tiers (where the compression ratio is lower and the resources required are lower as well), and the data sets with low activity level are placed at the bottom tiers (where the compression ratio is higher but the resources required to read/write data are higher as well). This approach utilizes a single dimensionality in the placement decision.

Embodiments of the presently described multi-dimensional placement finds a combination of compression algorithm and drive type to provide a best storage area per the data set properties. Different compression algorithms may offer different benefits and disadvantages and the placement decision incorporates this property into the decision.

Various compression algorithms may differ in the following attributes: the compression ratio; the required memory; the required Central Processing Unit (CPU) resources upon compression (from which the wait time for writes can be determined); and the required CPU resources upon decompression (from which the wait time for reads can be determined).

Flash drive types are differed by the following parameters: the size of the drive, even if flash drives offer roughly the same bandwidth, the size of the drive determines the bandwidth/Giga Byte (GB) ratio; and writes per day (WPD). Certain flash drives offer more writes then other flash drives (e.g., 1WPD, 3WPD, 10WPD etc.).

Referring to FIG. 1, one embodiment of a system 100 for providing multi-dimensional placement of data is shown. System 100 includes a host system 102 which includes a multi-dimensional placement module 104. Storage system 106 is coupled to the host system 102. The storage system 106 is shown containing multiple data sets (data set 1 through data set n). Also shown are storage buckets (storage area 1 through storage area m). Different data sets may be stored in different storage areas (buckets), there is not necessarily a 1:1 relation between, for example, data set 1 and storage area 1.

The number or buckets can be defined as:

\# Compression_Algorithms X \# Different_Drive_Types

Each such bucket may be defined by the different parameters it has, as defined above for different compression algorithms (compression ratio, memory, CPU for compression, CPU for decompression) and different drive types (bandwidth/Gigabyte, WPD)

Each data set (a data set can be an extent of a small size, which is stored and viewed as sequential by the application) will consider the following parameters: Service Level Objection (SLO); an expected number of reads; and an expected number of writes.

Each data set may have different parameters for different compression algorithms (e.g. different data sets have different compression ratios). Accordingly, these parameters are considered per data set, and not per bucket. Each data set is placed in the determined bucket, such that SLO is met, and none of the resources are over utilized (drive bandwidth, drive capacity, memory, CPU).

The system memory and CPU may be limited, which may require using algorithms which require less resources. The system capacity may also be limited, which may require using algorithms which offer greater compression ratios.

The buckets, as defined in this algorithm, may not have a constant size, as they depend on the compression algorithm. It should be noted that a greedy algorithm is used as the problem is NP-complete. Each group of buckets may also have constant resources such as size, bandwidth etc., as they represent a certain drive type. The groups of buckets also have limited resources. The drive bandwidth for reads may be limited, which may require the need to use smaller drives. The drive WPD for reads may be limited, which may require the use of better drives.

As an example, if there are three device types (dev1, dev2, and dev3) and three different compression algorithms (compression 1, compression 2, compression 3), then an array with a total of nine buckets are utilized. The nine buckets would be:

Bucket 1: dev1, compression 1
Bucket 2: dev1, compression 2
Bucket 3: dev1, compression 3
Bucket 4: dev2, compression 1
Bucket 5: dev2, compression 2
Bucket 6: dev2, compression 3
Bucket 7: dev3, compression 1
Bucket 8: dev3, compression 2
Bucket 9: dev3, compression 3

A bucket for each data set is determined, and the data set is placed there. If one of the system level/bucket group level resources is finished there is a requirement to revert the data and choose a second bucket.

A methodology is used with adjusting constants to deal with such cases. In one embodiment, the data sets are ordered according to the SLO, the number of writes, and the number of reads.

In one embodiment, the following formula is used to determine, for a single data set, which bucket the data set will be stored in.

A*SLO_MISS_ON_READS*\# Reads+B*SLO_MISS_ON_WRITES*\# Writes+C*CPU_CYCLES_ON_ READ*reads+D*CPU_CYCLES_ON_WRITES*\# Writes+E*MEMORY_REQUIREMENT*DataSetSize+F*(1/COMPRESSION_RATIO)*DataSetSize The parameters SLO_MISS_ON_READS comprises a value regarding how much the required SLO is missed when placing the data set in that storage area, SLC _MISS_ON_WRITES comprises a value regarding how much the required SLO is missed when placing the data set in that storage area, CPU_CYCLES_ON_READS comprises a number of CPU cycles required for each read, CPU_CYCLES_ON_WRITES comprises a number of CPU cycles required for each write, MEMORY_REQUIREMENT comprises an amount of memory required to store the data set, COMPRESSION_RATIO comprises a compression ratio for the data set in the storage area, and wherein A-F comprise factors for adjusting a weight given to each parameter.

At the start of the procedure, certain factors are set that would optimize the placement of a certain data set in a certain bucket. For example, at start time, factors A and B that represent SLO misses may be set to be very high so that would not allow or minimize SLO misses.

At each placement of a data set, the bucket group and system level resources utilization are calculated, and based on the results the factors may be amended such that limited resources would be less favorable to be further exploited.

In some embodiments, each resource utilization level may have ten steps (0-10% utilized up to 90-100% utilized). As a resource utilization level is moved up a step, the factor related to that resource would be changed, such that the resource we would be given less consideration for placing other data sets. As an example, in the case where memory utilization reaches fifty percent, while all other resources are much lower, factor E would be changed such that the formula would now favor buckets that have more reserve memory.

While reaching very high utilization, the variables related may become extremely high, making the saving of that resource most crucial. In a scenario where ninety percent memory utilization was reached, parameter E would be set to such a high value, that it would be almost certain that other buckets that use less memory will be the ones that are chosen.

FIGS. 2A and 2B are a flow diagram showing illustrative processing, according to embodiments of the disclosure. In some embodiments, rectangular elements (typified by element 202 in FIG. 2), herein denoted "processing blocks," represent computer software instructions or groups of instructions. In other embodiments, processing blocks may represent steps performed by functionally equivalent circuits such as a digital signal processor (DSP) circuit or an application specific integrated circuit (ASIC). The flow diagrams do not depict the syntax of any particular programming language but rather illustrate the functional information one of ordinary skill in the art requires to fabricate circuits or to generate computer software to perform the processing required of the particular apparatus. It should be noted that many routine program elements, such as initialization of loops and variables and the use of temporary variables may be omitted for clarity. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order.

Referring to the embodiment of FIG. 2A and FIG. 2B, an embodiment of a method 200 for multi-dimensional placement is shown. Processing block 202 discloses ordering a plurality of data sets. The data sets are ordered wherein a first data set of the plurality of data sets is considered most critical. As shown in processing block 204 in one embodiment the ordering a plurality of data sets may comprise ordering the data sets according to a service level objective (SLO) associated with the data set, a number of writes associated with the data set, and a number of reads associated with the data set.

As shown in processing block 206, in one embodiment determining, for a single data set, which bucket to use is done according to a formula comprising:

A*SLO_MISS_ON_READS*# Reads+B*SLO_MISS_ON_WRITES*# Writes+C*CPU_CYCLE_ON_READ*reads+D*CPU_CYCLES_ON_WRITES*Writes+E*MEMORY_REQUIREMENT*DataSetSize+F*(1/COMPRESSION_RATIO)*DataSetSize Wherein the parameters SLO_MISS_ON_READS comprises a value regarding how much the required SLO is missed when placing the data set in that storage area, SLO_MISS_ON_WRITES comprises a value regarding much the required SLO is missed when placing the data set in that storage area, CPU_CYCLES_ON_READS comprises a number of CPU cycles required for each read, CPU_CYCLES_ON_WRITES comprises a number of CPU cycles required for each write, MEMORY_REQUIREMENT comprises an amount of memory required to store the data set, COMPRESSION_RATIO comprises a compression ratio for the data set in the storage area, and wherein A-F comprise factors for adjusting a weight given to each parameter. Each parameter may be individually adjusted by adjusting the value of the parameter factor (e.g. factor E for parameter MEMORY_REQUIREMENT).

Processing continues at processing block 208 which shows defining a plurality of storage areas (buckets) based on a storage device type, an associated compression algorithm, and a plurality of parameters associated with different properties of the compression algorithm and the particular storage device.

Processing block 210 discloses placing a data set in a selected storage area based on a determination of which storage area provides a desired combination of the storage device type and compression. In the event a storage area is deemed the preferred storage area, but the data set cannot be stored there (e.g. not enough available free space), then a next preferred storage area is used for the particular data set. Processing block 212 shows wherein after placement of a data set into a storage area, repeating for a next data set in the order the placing of a data set in a selected storage area.

Processing block 212 recites ordering a plurality of data sets further comprises ordering the data sets according to a service level objective (SLO) associated with the data set, a number of writes associated with the data set, and a number of reads associated with the data set.

As further shown in FIG. 2B block 214, each storage device has an associated resource utilization level. Processing block 216 discloses adjusting a factor for a parameter when the resource utilization level exceeds a predetermined value. Processing block 218 recites wherein each resource utilization level has a predetermined number of utilization percentage steps and wherein when a resource utilization level exceeds a current step, then adjusting the factor for that parameter.

FIG. 3 shows an illustrative computer 300 that can perform at least part of the processing described herein, according to an embodiment of the disclosure. The computer 300 may include a processor 302, a volatile memory 304, a non-volatile memory 306 (e.g., hard disk), an output device 320 and a graphical user interface (GUI) 308 (e.g., a mouse, a keyboard, a display, for example), each of which is coupled together by a bus 318. The non-volatile memory 306 may be configured to store computer instructions 312, an operating system 314, and data 316. In one example, the computer instructions 312 are executed by the processor 302 out of volatile memory 304. In some embodiments, the computer 300 corresponds to a virtual machine (VM). In other embodiments, the computer 300 corresponds to a physical computer.

Referring again to FIG-. 3, processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g.. CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. The program logic may be run on a physical or virtual processor. The program logic may be run across one or more physical or virtual processors.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that the scope of protection sought herein should not be limited to the described embodiments but rather should be limited only by the spirit and scope of the following claims.

I claim:

1. A method for multi-dimensional determination of data placement in storage devices of a storage system, the method comprising:
   ordering a plurality of data sets, wherein data sets identified as having a greater number of reads and writes than others of the data sets are placed higher in the ordering;
   defining a plurality of storage areas based on storage device types of the storage devices, associated compression algorithms, and a plurality of parameters associated with different properties of the storage devices and the compression algorithms being used;
   storing a first data set of the plurality of data sets in a selected storage area of one of the storage devices based on a determination of which of the storage areas provides a desired combination of compression and storage device type for the first data set; and
   storing, in another selected storage area of one of the storage devices, a next data set of the plurality of data sets based on the ordering, the storing the next data set is based on a determination of which of the storage areas provides a desired combination of compression and storage device type for the next data set;
   wherein utilization of resources of the storage system is a function of the desired combination, and the desired combination is configured to prevent overutilization of the resources.

2. The method of claim 1 wherein ordering a plurality of data sets further comprises ordering the data sets according to a service level objective (SLO) associated with each of the plurality of data sets, a number of writes associated with each of the plurality of data sets, and a number of reads associated with each of the plurality of data sets.

3. The method of claim 1 wherein the selected storage area is determined according to a formula comprising:
   A*SLO_MISS_ON_READS*# Reads+B*SLO_MISS_ON_WRITES*# Writes+C*CPU_CYCLES_ON_READ*reads+D*CPU_CYCLES_ON_WRITES*# Writes+E*MEMORY_REQUIREMENT*DataSetSize+F*(1/COMPRESSION_RATIO)*DataSetSize
   wherein the parameters SLO_MISS_ON_READS comprises a value regarding how much the required SLO is missed when placing the data set in that storage area, SLO_MISS_ON_WRITES comprises a value regarding much the required SLO is missed when placing the data set in that storage area, CPU_CYCLES_ON_READS comprises a number of CPU cycles required for each read, CPU_CYCLES_ON_WRITES comprises a number of CPU cycles required for each write, MEMORY_REQUIREMENT comprises an amount of memory required to store the data set, COMPRESSION_RATIO comprises a compression ratio for the data set in the storage area, and wherein A-F comprise factors for adjusting a weight given to each parameter.

4. The method of claim 1 wherein each of the storage devices has an associated resource utilization level, the method further comprising adjusting a factor for a parameter when the resource utilization level exceeds a predetermined value.

5. The method of claim 4 wherein each resource utilization level has a predetermined number of utilization percentage steps and wherein when a resource utilization level exceeds a current step, then adjusting the factor for that parameter;
   wherein the adjusting the factor for the parameter when the resource utilization level exceeds the predetermined value, in conjunction with the desired combination of compression and storage device type, further prevents overutilization of the resources.

6. The method of claim 1 wherein the storage device types are classified according to:
   storage device bandwidth; and
   writes per day.

7. A system for multi-dimensional determination of data placement in storage devices of a storage system, the system comprising:
   a processor; and
   memory storing computer program code that when executed on the processor causes the processor to operate a storage system, the storage system operable to perform the operations of:
   ordering a plurality of data sets, wherein data sets identified as having a greater number of reads and writes than others of the data sets are placed higher in the ordering;
   defining a plurality of storage areas based on storage device types of the storage devices, associated compression algorithms, and a plurality of parameters associated with different properties of the storage devices and the compression algorithms being used; and
   storing a first data set of the plurality of data sets in a selected storage area of one of the storage devices based on a determination of which of the storage areas provides a desired combination of compression and storage device type for the first data set; and
   storing, in another selected storage area of one of the storage devices, a next data set of the plurality of data sets based on the ordering, the storing the next data set is based on a determination of which of the storage areas provides a desired combination of compression and storage device type for the next data set;
   wherein utilization of resources of the storage system is a function of the desired combination, and the desired combination is configured to prevent overutilization of the resources.

8. The system of claim 7 wherein ordering a plurality of data sets further comprises ordering the data sets according to a service level objective (SLO) associated with each of the plurality of data sets, a number of writes associated with each of the plurality of data sets, and a number of reads associated with each of the plurality of data sets.

9. The system of claim 7 wherein the selected storage area is determined according to a formula comprising:

A*SLO_MISS_ON_READS*# Reads+B*SLO_MISS_ON_WRITES*# Writes+C*CPU_CYCLES_ON_READ*reads+D*CPU_CYCLES_ON_WRITES*# Writes+E*MEMORY_REQUIREMENT*DataSetSize+F*(1/COMPRESSION_RATIO)*DataSetSize wherein the parameters SLO_MISS_ON_READS comprises a value regarding how much the required SLO is missed when placing the data set in that storage area, SLO_MISS_ON_WRITES comprises a value regarding much the required SLO is missed when placing the data set in that storage area, CPU_CYCLES_ON_READS comprises a number of CPU cycles required for each read, CPU_CYCLES_ON_WRITES comprises a number of CPU cycles required for each write, MEMORY_REQUIREMENT comprises an amount of memory required to store the data set, COMPRESSION_RATIO comprises a compression ratio for the data set in the storage area, and wherein A-F comprise factors for adjusting a weight given to each parameter.

10. The system of claim 7 wherein each of the storage devices has an associated resource utilization level, the operations further comprising adjusting a factor for a parameter when the resource utilization level exceeds a predetermined value.

11. The system of claim 10 wherein each resource utilization level has a predetermined number of utilization percentage steps and wherein when a resource utilization level exceeds a current step, then adjusting the factor for that parameter;

wherein the adjusting the factor for the parameter when the resource utilization level exceeds the predetermined value, in conjunction with the desired combination of compression and storage device type, further prevents overutilization of the resources.

12. A computer program product for multi-dimensional determination of data placement in storage devices of a storage system, the computer program product including a non-transitory computer readable storage medium having computer program code encoded thereon that when executed on a processor of a computer causes the computer to operate a storage system, the computer program product comprising:

computer program code for ordering a plurality of data sets, wherein data sets identified as having a greater number of reads and writes than others of the data sets are placed higher in the ordering;

computer program code for defining a plurality of storage areas based on storage device types of the storage devices, associated compression algorithms, and a plurality of parameters associated with different properties of the storage devices and the compression algorithms being used;

computer program code for storing a first data set of the plurality of data sets in a selected storage area of one of the storage devices based on a determination of which of the storage areas provides a desired combination of compression and storage device type for the first data set; and computer program code for storing, in another selected storage area of one of the storage devices, a next data set of the plurality of data sets based on the ordering, the storing the next data set is based on a determination of which of the storage areas provides a desired combination of compression and storage device type for the next data set;

wherein utilization of the resources of the storage system is a function of the desired combination, and the desired combination is configured to prevent overutilization of the resources.

13. The computer program product of claim 12 further comprising computer program code for ordering a plurality of data sets further comprises ordering the data sets according to a service level objective (SLO) associated with each of the plurality of data sets, a number of writes associated with each of the plurality of data sets, and a number of reads associated with each of the plurality of data sets.

14. The computer program product of claim 12 further comprising computer program code wherein the selected storage area is determined according to a formula comprising:

A*SLO_MISS_ON_READS*# Reads+B*SLO_MISS_ON_WRITES*# Writes+C*CPU_CYCLES_ON_READ*reads+D*CPU_CYCLES_ON_WRITES*# Writes+E*MEMORY_REQUIREMENT*DataSetSize+F*(1/COMPRESSION_RATIO)*DataSetSize wherein the parameters SLO_MISS_ON_READS comprises a value regarding how much the required SLO is missed when placing the data set in that storage area, SLO_MISS_ON_WRITES comprises a value regarding much the required SLO is missed when placing the data set in that storage area, CPU_CYCLES_ON_READS comprises a number of CPU cycles required for each read, CPU_CYCLES_ON_WRITES comprises a number of CPU cycles required for each write, MEMORY_REQUIREMENT comprises an amount of memory required to store the data set, COMPRESSION_RATIO comprises a compression ratio for the data set in the storage area, and wherein A-F comprise factors for adjusting a weight given to each parameter.

15. The computer program product of claim 12 wherein each of the storage devices has an associated resource utilization level, the computer program product further comprising computer program code for adjusting a factor for a parameter when the resource utilization level exceeds a predetermined value.

16. The computer program product of claim 15 further comprising computer program code for adjusting a factor for a parameter when the resource utilization level exceeds a predetermined value, and wherein each resource utilization level has a predetermined number of utilization percentage steps and wherein when a resource utilization level exceeds a current step, then adjusting the factor for that parameter;

wherein the adjusting the factor for the parameter when the resource utilization level exceeds the predetermined value, in conjunction with the desired combination of compression and storage device type, further prevents overutilization of the resources.

* * * * *